US012581789B2

(12) United States Patent
Leijtens et al.

(10) Patent No.: US 12,581,789 B2
(45) Date of Patent: Mar. 17, 2026

(54) MODULE LAYUP FOR PEROVSKITE-SILICON TANDEM SOLAR CELLS

(71) Applicant: Swift Solar Inc., San Carlos, CA (US)

(72) Inventors: Tomas Leijtens, Redwood City, CA (US); Jiang Huang, San Jose, CA (US); In Cheon Baik, Redwood City, CA (US)

(73) Assignee: Swift Solar Inc., San Carlos, CA (US)

( * ) Notice: Subject to any disclaimer, the term of this patent is extended or adjusted under 35 U.S.C. 154(b) by 51 days.

(21) Appl. No.: 18/458,868

(22) Filed: Aug. 30, 2023

(65) Prior Publication Data

US 2024/0121971 A1    Apr. 11, 2024

Related U.S. Application Data

(60) Provisional application No. 63/378,585, filed on Oct. 6, 2022.

(51) Int. Cl.
| | |
|---|---|
| *H10K 39/12* | (2023.01) |
| *H10K 30/57* | (2023.01) |
| *H10K 30/83* | (2023.01) |
| *H10K 39/00* | (2023.01) |
| *H10K 39/15* | (2023.01) |
| *H10K 39/18* | (2023.01) |

(Continued)

(52) U.S. Cl.
CPC ............. *H10K 39/12* (2023.02); *H10K 30/57* (2023.02); *H10K 30/83* (2023.02); *H10K 39/15* (2023.02); *H10K 39/18* (2023.02);

*H10K 39/621* (2023.02); *H10K 71/50* (2023.02); *H10K 85/50* (2023.02); *H10K 2102/20* (2023.02)

(58) Field of Classification Search
CPC ........ H10K 39/12; H10K 30/57; H10K 30/83; H10K 39/15; H10K 39/18; H10K 39/621; H10K 71/50; H10K 85/50; H10K 2102/20; H10K 30/15; H10K 30/40; H10K 30/81; Y02E 10/549; H10F 10/19; H10F 19/902; H10F 71/00
See application file for complete search history.

(56) References Cited

U.S. PATENT DOCUMENTS

| | | | |
|---|---|---|---|
| 9,397,252 B2 | 7/2016 | Morad et al. |
| 2014/0352751 A1 | 12/2014 | Wu et al. |

(Continued)

FOREIGN PATENT DOCUMENTS

| | | |
|---|---|---|
| CN | 212257416 U | 12/2020 |
| EP | 3149775 B1 | 12/2019 |

(Continued)

OTHER PUBLICATIONS

PCT/US2023/033350, "PCT Notification of Transmittal of the International Search Report and the Written Opinion of the International Searching Authority, or the Declaration", mailed Jan. 10, 2024, 11 pages.

(Continued)

*Primary Examiner* — Angelo Trivisonno
(74) *Attorney, Agent, or Firm* — Aikin & Gallant, LLP

(57) ABSTRACT

Solar cell modules and methods of fabrication are described. In an embodiment, a pair of tandem solar cells are bonded together along a contact ledge of a first tandem solar cell using a solid electrically conductive bonding material.

10 Claims, 10 Drawing Sheets

(51) Int. Cl.
  *H10K 71/50*      (2023.01)
  *H10K 85/50*      (2023.01)
  *H10K 102/20*     (2023.01)

(56)                References Cited

U.S. PATENT DOCUMENTS

2020/0295209 A1    9/2020  Bush
2022/0102659 A1*   3/2022  Kamino ................. H10K 30/80

FOREIGN PATENT DOCUMENTS

KR    1020190115382 B1    10/2019
WO      2022186534 A1      9/2022

OTHER PUBLICATIONS

PCT/US23/33350, "PCT Notification Concerning Transmittal of International Preliminary Report on Patentability," mailed Apr. 17, 2025, 7 pages.

* cited by examiner

115

181

| Metal Fingers | 180 |
| Electrode | 170 |
| ETL | 150 |
| Absorber | 140 |
| HTL | 130 |
| Recombination Layer | 355 |
| n+Si | 350 |
| n-Si | 330 |
| p+Si | 351 |
| Electrode | 310 |

220B

220A

MODULE LAYUP FOR PEROVSKITE-SILICON TANDEM SOLAR CELLS

RELATED APPLICATIONS

This application claims the benefit of priority of U.S. Provisional Application No. 63/378,585 filed Oct. 6, 2022 which is incorporated herein by reference.

BACKGROUND

Field

Embodiments described herein relate to solar cells, and more particularly to serial connections made between overlapping tandem solar cells.

Background Information

Photovoltaic cells, also referred to as solar cells, are devices that convert radiant photo energy into electrical energy. Multiple solar cells may be integrated into a group to constitute a solar panel, or module, in which some or all of the solar cells are usually connected in series creating an additive voltage.

Conventional silicon solar cells are connected and placed into modules in two main ways. In a first implementation full or half cells are connected by soldering wires or flat busbar ribbons to the front of the solar cell, and specifically to screen printed metal fingers or busbars. The attached busbar is longer than the cell and can make contact to the back of the next cell in a series connection. In another implementation smaller cells are connected in series through a process in which the top of one cell is placed under the next cell and so on using an electrically conducting bond, allowing the positive terminal of one cell to contact the negative terminal of the next cell, or vice versa depending on the type of solar cell used.

SUMMARY

Solar cell modules including overlapping tandem solar cells and methods of fabrication are described. In some embodiments a contact ledge is patterned into the tandem solar cells, to mitigate stress placed onto the top subcells of the tandem solar cells. More specifically, a contact ledge can be formed through an upper perovskite subcell in an tandem perovskite-silicon subcell such that when serial tandem subcells are connected this may be achieved by bonding the back side of a tandem solar cell to the contact ledge of an underlying tandem solar cell. More specifically, the contact ledge may be over the lower silicon subcell of the overlapping tandem solar cells so that pressure is not directly applied over the perovskite subcell.

In some embodiments low temperature electrically conductive bonding materials, such as solid adhesive tapes, may be utilized to bond serial overlapping tandem solar cells to one another, or to bond busbars to the tops of the tandem solar cells. Such a low temperature electrically conductive bonding material may mitigate perovskite subcell material degradation associated with thermal exposure.

DETAILED DESCRIPTION

Figure 1:
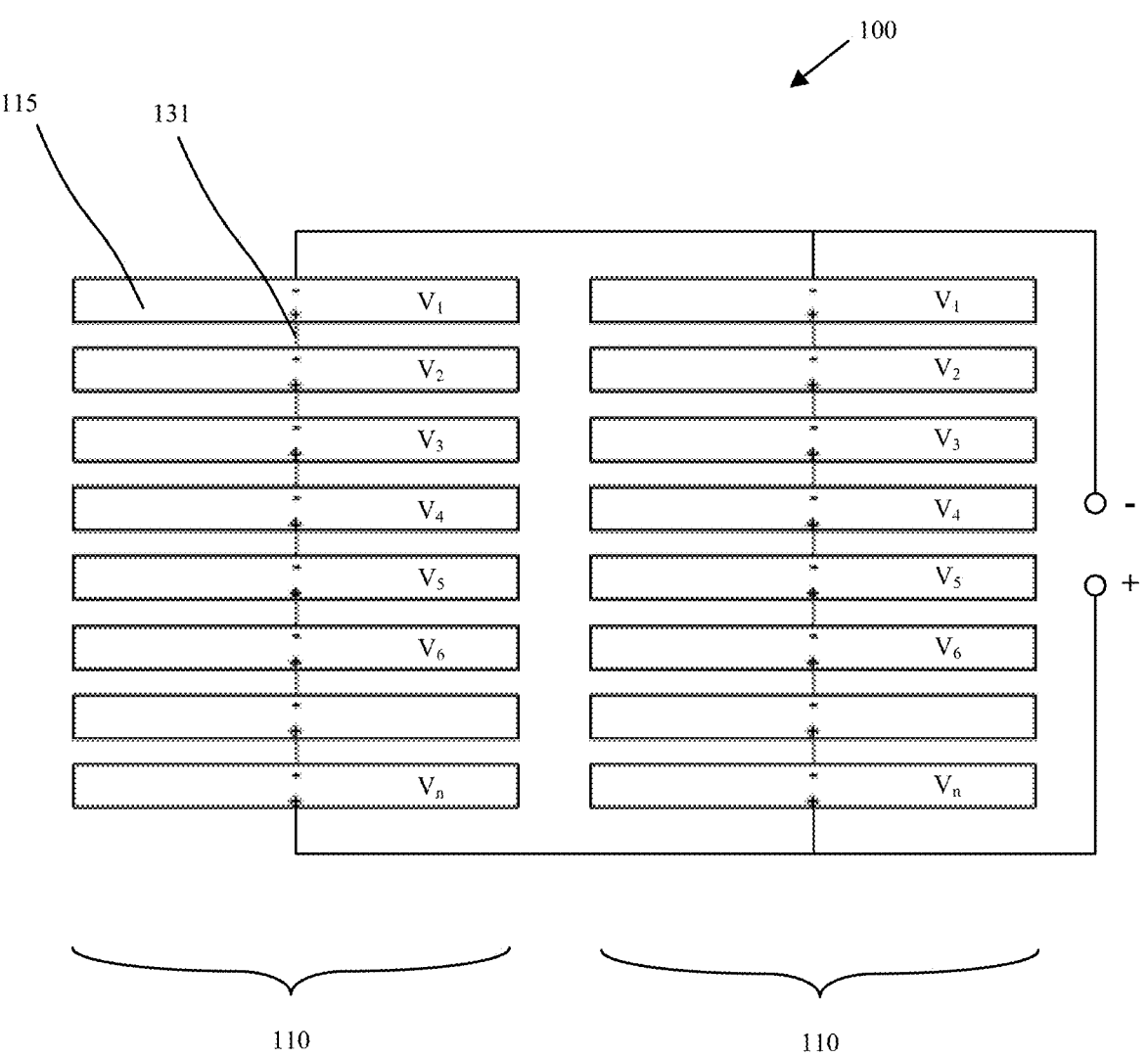
FIG. 1 is a schematic top view illustration and circuit diagram of a solar cell module in accordance with embodiments.

Embodiments describe solar cell modules and methods of fabrication. In an embodiment, a solar cell module includes a first tandem solar cell including a first lower silicon subcell and a first upper perovskite subcell patterned to form a contact ledge over the first lower silicon subcell. A back side of a second tandem solar cell then be bonded to the contact ledge of the first tandem solar cell with an electrically conductive bonding material. In this way, the force exerted by the back side of the second tandem solar cell on the top side of the first tandem solar cell during assembly, handling, etc., can be absorbed by the first lower silicon subcell rather than by the comparatively weaker perovskite subcell, which can mitigate potential mechanical breakage of the perovskite subcell. Further, the second or upper tandem solar cell can be positioned so there is minimal overlap with the first or lower tandem solar cell so as to not obscure the solar cells of the first or lower tandem solar cell. Any suitable electrically conductive bonding material, such as solder, an electrically conductive adhesive layer, such as solid adhesive tape, liquid adhesive material etc. can be utilized in such a configuration to transfer stress.

In some embodiments, an electrically conductive adhesive layer, such as solid adhesive tape is used for bonding the tandem solar cells. In this manner, high temperature bonding processes, such as with solder, can be avoided which could degrade the perovskite subcell materials. Furthermore, the solid adhesive tape can avoid reflow and degradation that could occur with a liquid adhesive material. In addition, the contact ledge over the first lower silicon subcell can absorb bonding pressures so that conductive materials (e.g. pins, particles, etc.) within the electrically conductive adhesive layer are not transferred to an underlying perovskite layer, which may be more susceptible to mechanical deformation, and hence device degradation.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic top view illustration is provided of a solar cell module in accordance with embodiments. As shown, the solar cell module 100 includes a plurality of cells 115 (also referred to as solar cells) coupled in series with interconnects 131, with the front of one cell connected to the rear of the next cell so that their voltages ($V_1 \ldots V_n$) add. The plurality of cells 115 may be arranged into one or more subsets 110 (e.g. strings) coupled in parallel, which may have the effect of decreasing total module voltage. Other arrangements, in which the second row of cells are aligned half a cell length off-center of the first row, the third row a half cell length from the second, etc., are also possible. In the latter, an entire row of several cells will be connected in parallel. This layout is sometimes referred to as a "matrix" array.

Figure 2A:
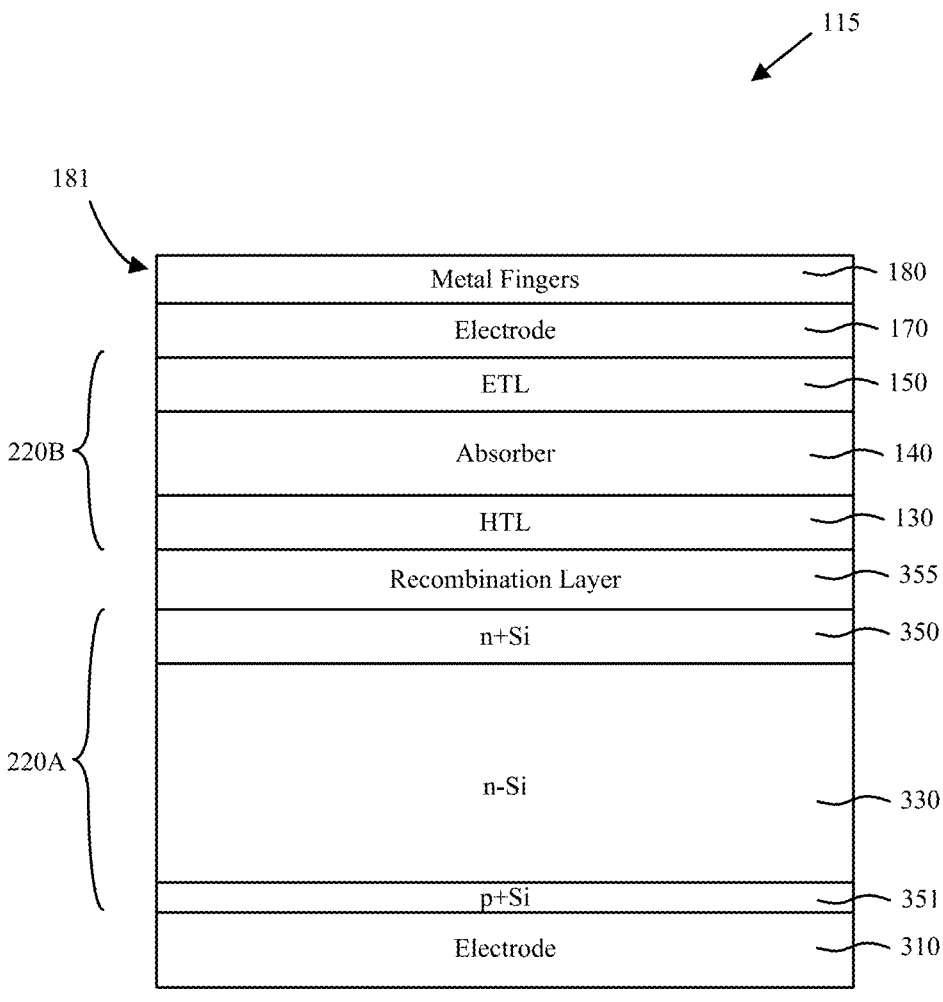
FIG. 2A is an illustrative diagram of a silicon-perovskite tandem solar cell stack-up based on an n-type silicon substrate in accordance with an embodiment.
Figure 2B:
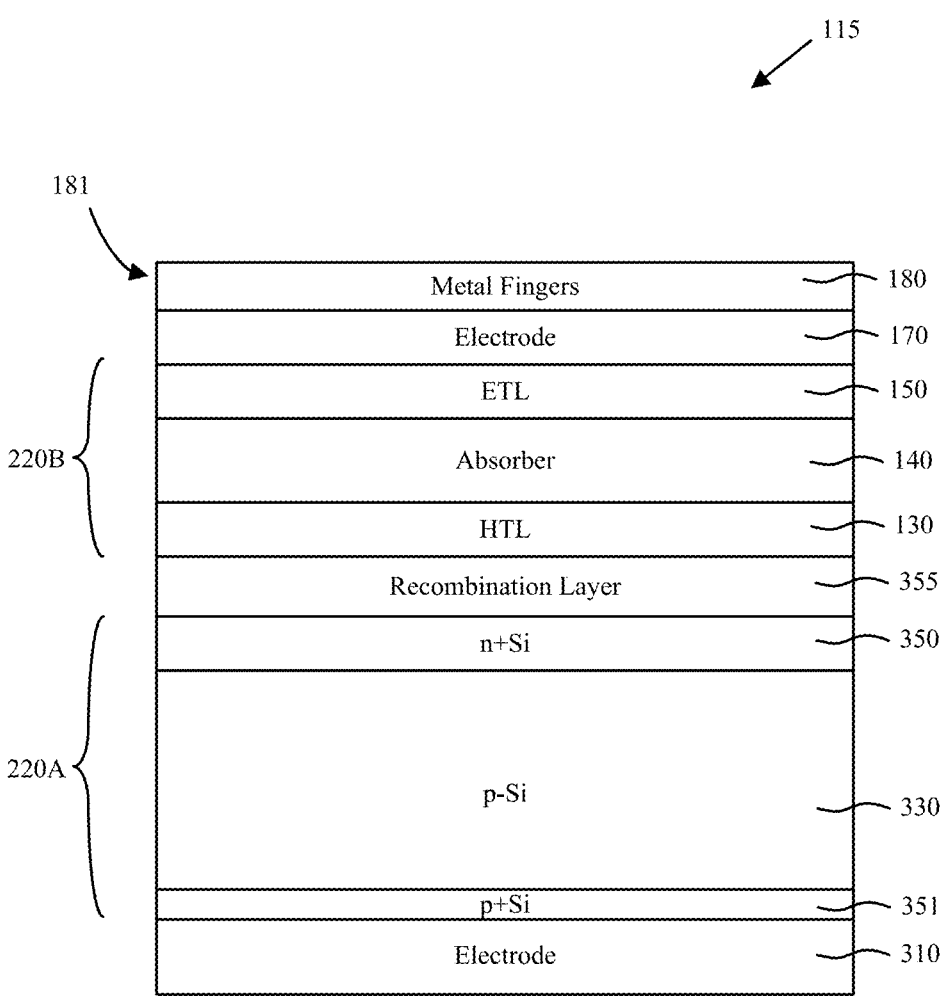
FIG. 2B is an illustrative diagram of a silicon-perovskite tandem solar cell stack-up based on a p-type silicon substrate in accordance with an embodiment.

Referring now to FIGS. 2A-2B, FIG. 2A is a silicon-perovskite tandem solar cell stack-up based on an n-type silicon substrate in accordance with embodiments; FIG. 2B is a silicon-perovskite tandem solar cell stack-up based on a p-type silicon substrate in accordance with embodiments. In the following description various layers and compositions are described for the solar cell stack-ups. It is to be appreciated that each layer may include a single layer, or multiple layers. Furthermore, reference to bottom or top layers herein is relative and may not be reflective of actual orientation in product.

In the particular embodiments illustrated in FIGS. 2A-2B, the solar cells 115 may absorb light from the top side of the illustrated stack-ups. Referring to FIG. 2A, the tandem structure may include an upper perovskite subcell 220B formed over a lower silicon subcell 220A including a doped silicon substrate 330 (e.g. n-doped substrate), a p-doped silicon layer 351 (e.g. p+ doped), and optionally an n-doped silicon layer 350 (e.g. n+ doped). A back side contact 310 may also be formed underneath the p-doped silicon layer 351. Back side contact 310 may be formed of a suitable material such as Ag, Cr, Au, Cu, Al, etc. It is to be appreciated that the exemplary silicon subcells 220A and contacts can include a variety of configurations in accordance with all embodiments, including heterojunction (HJT) design, tunnel oxide passivated contacts (TOPCon), passivated rear contact solar cell (PERC), etc.

The n-doped silicon layer 350 (e.g. n+ doped) and p+ doped silicon layer 351 may be crystalline, polycrystalline such as with TOPCon design, or amorphous, such as with an HJT design. In such an HJT design additional intrinsic layers (e.g. intrinsic silicon) may be formed between the doped silicon substrate 330 and the p-doped silicon layer 351 and n-doped silicon layer 350. For example, the intrinsic layers may be formed by treating the doped silicon substrate 330, such as with hydrogen plasma. The intrinsic layer(s) may also be crystalline or amorphous.

A recombination layer 355 can be located between the subcells 220. The recombination layer 355 may be formed of a transparent conducting material such as a TCO, or ITO specifically.

The perovskite subcell 220B includes an absorber layer 140 and one or more transport layers. In the embodiment illustrated, the perovskite subcell 220B includes a hole transport layer (HTL) 130 over the optional recombination layer 355, an absorber layer 140 over the HTL 130, and an electron transport layer (ETL) 150 over the absorber layer 140.

The HTL 130 may include one or more layers formed of a metal oxide such as nickel oxide (NiOx) or vanadium oxide ($V_2O_5$), an organic polymer such as poly(triaryl amine) (PTAA), small molecules such as 2,2',7,7'-Tetrakis [N,N-di(4-methoxyphenyl)amino]-9,9'-spirobifluorene (spiro-MeOTAD), or a "self-assembled monolayer" in which hole transporting moieties are attached to the underlying TCO or HTL layer via an acid binder group such as a phosphoric acid or carboxylic acid. The HTL 130 may additionally be doped to increase conductivity, and may include a bi-layer of a metal oxide (e.g. NiOx) and an organic layer such as PTAA on top.

The absorber layer 140 in accordance with embodiments may be formed of a perovskite material. Perovskite materials may be characterized by the formula $ABX_3$, with A representing a large atomic or molecular cation (e.g. Cs, methylammonium, formamidinium, etc.), with B representing a positively charged cation (e.g. metal, lead, plumbate, Sn), and X representing a negatively charged anion (e.g. halide, I, Br, Cl). Perovskite materials can also include a mixture of 2D and 3D structures in the family of $A^1_m A_n B_{n-1} X3_{n-1}$ where $A^1$ represents a positively charged cation (e.g. butylammonium, phenethylammonium, guanidinium, etc.) Alternative materials such as organic materials can also be used as the absorber layer.

ETL 150 in accordance with embodiments can be formed of fullerenes, metal halides, tin oxide, titanium oxide, naphthalene diimide and related derivatives, etc. An additional buffer layer may be included as part of or on top of the ETL 150. For example, the buffer layer can physically separate the electrode layer, or top metal pattern, from the subcell, and more specifically the absorber layer. In an embodiment, the buffer layer is formed of a metal oxide material such as tin oxide, titanium diode, or aluminum zinc oxide (AZO) over a fullerene ETL 150. The buffer layer can function as a barrier layer as well as a charge transport layer. In a specific embodiment, electrode layer 170 is formed of a transparent conducting material.

Since the lower silicon subcell 220A may be opaque, the top electrode layer 170 may be formed of a transparent conducting layer such as poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. A top metal pattern 181 may then be formed over the transparent top electrode layer 170, for example to facilitate charge transport. In an embodiment, the top metal pattern is formed of a suitable material such as Ag, Cr, Au, Cu, Al, etc. The top metal pattern 181 may be formed in the shape of a plurality of metal finger 180 electrodes and optionally busbar connecting the plurality of metal finger electrodes so as to transport charge without overly blocking light transmission.

Referring to FIG. 2B, the tandem structure may include an upper perovskite subcell 220B formed over a lower silicon subcell 220A including a doped silicon substrate 330 (e.g. p-doped substrate), an n-doped silicon layer 350 (e.g. n+ doped), and optionally a p-doped silicon layer 351 (e.g. p+ doped). Thus, the lower silicon subcell 220A of FIG. 2B may be based upon a p-doped silicon substrate rather than the n-doped silicon substrate of FIG. 2A. In such an embodiment the p-doped silicon layer 351 may be optional as opposed to the n-doped silicon layer 350 being optional.

In each of the previous embodiments described with regard to FIGS. 2A-2B specific stack-ups are described and illustrated with a n-p, p-n, n-i-p, or p-i-n orientations are described. These changes in order of layer formation can additionally change materials selection of some layers without straying from the principles of the embodiments. Thus, reference to ETL or HTL and n-doped layer or p-doped layer may be reversed in accordance with embodiments.

In one aspect, it has been observed that conventional silicon solar cells are connected to each other by soldering metal busbars (usually 0.5-2 mm flat metal ribbons) to the front of the solar cell. Specifically, the busbar ribbons are soldered to the screen printed metal fingers and busbars (e.g. of a top metal pattern). The attached busbar is generally longer than the solar cell and can make contact to the next solar cell in a series connection. It has been observed however, that perovskite solar cells (and subcells) are sensitive to heat (e.g. temperatures greater than 150° C. are likely to cause damage, while soldering is usually done at >200° C.) as well as pin-point pressure, so the soldering process is likely to damage perovskite-silicon tandem solar cells. Furthermore, having the connection to the solar cell occur only at a few solder joints also reduces the mechanical stability of the solar cell. It has been observed that each joint is one of the most common sources of failure in a silicon solar cell.

In accordance with embodiments, these problems may be overcome or mitigated by using an electrically conductive adhesive (ECA) to secure the busbar to the solar cell, as well as to bond serial solar cells. While ECAs are available as both liquid and solid during application, it has been observed that the liquids used in most commercial ECAs may damage perovskite solar cells or subcells, so may not be suitable for tandem production. It has been observed that during curing of ECAs that are liquid during application, that the polymer binder component of the adhesives tends to "leak" out of the desired area, negatively affecting the optical properties in cell areas next to the busbars. In accordance with several embodiments, solid ECA tapes may be employed. These may include a polymer matrix adhesive (e.g. acrylic, silicone, butyl rubber, etc.) in which electrically conductive particles (such as those made of metals such as silver, copper, aluminum, nickel or those made of carbon) and/or wires or pins (depending on whether only Z or XYZ conductivity is desired), or metal-coated particles are embedded. When laminated under pressure, the particles and/or wires or pins transport current directly between the two materials the tape is placed between.

Figure 3A:
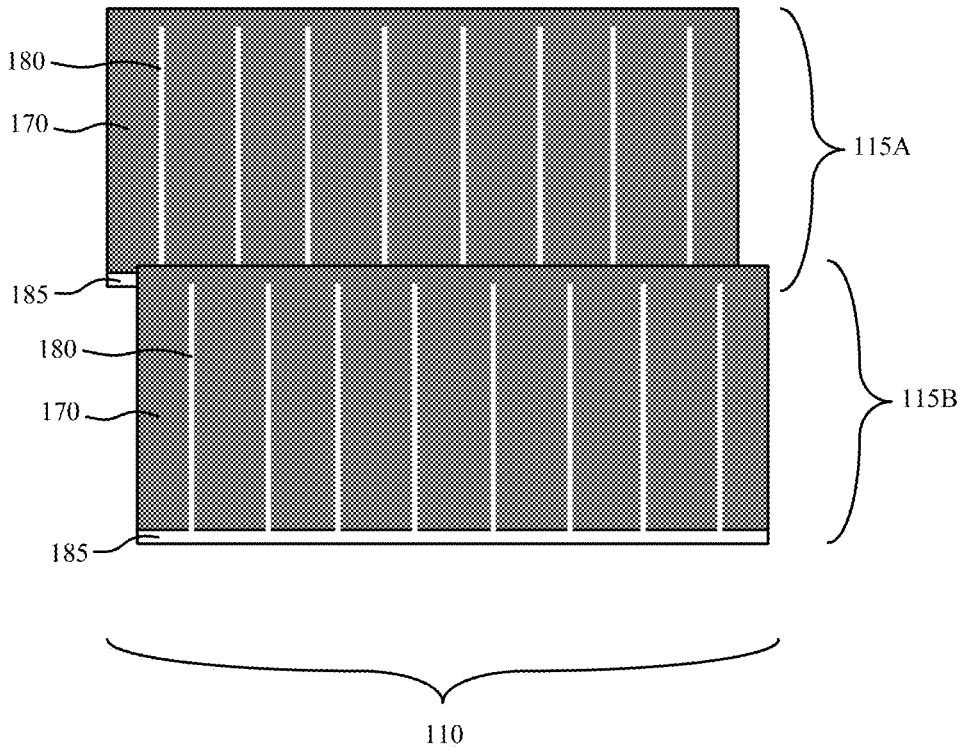
FIG. 3A is schematic top view illustration of a pair of overlapped solar cells in accordance with an embodiment.
Figure 3B:
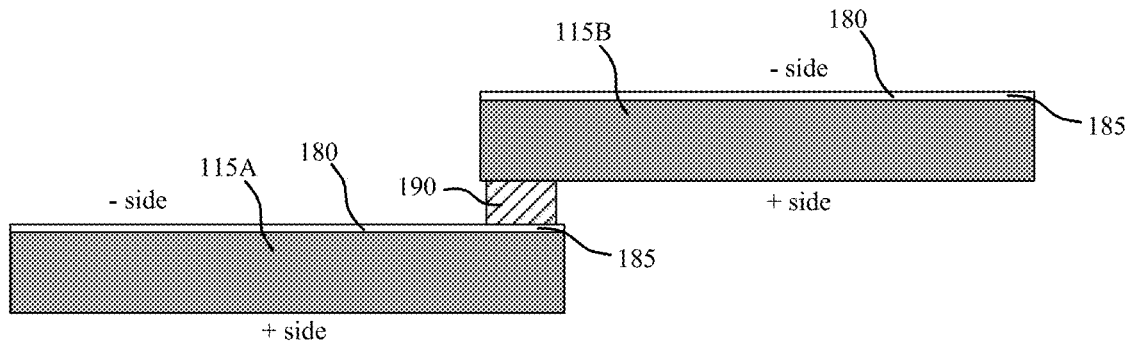
FIG. 3B is a schematic side view illustration of a pair of overlapped solar cells in accordance with an embodiment.

Referring now to FIGS. 3A-3B schematic top view and cross-sectional side view illustrations are provided for a pair of overlapped tandem solar cells 115 in accordance with an embodiment. As shown, a back side of a second tandem solar cell 115B (top solar cell) can be bonded to a first tandem solar cell 115A (bottom solar cell) with an electrically conductive adhesive layer (ECA) 190. Specifically, the ECA 190 may be applied as a solid conductive tape rather than as a liquid adhesive. Such a solid tape may not necessitate curing at temperatures common to liquid adhesive materials, which can include silver particles requiring a curing temperature that is too high for perovskite. A solid ECA 190 tape may also provide improved mechanical properties since the mechanical connection between cells relies on a polymer adhesive. This is especially important for modules that may have to withstand vibrations or be curved in shape. Still referring to FIGS. 3A-3B, bonding may optionally be made to a busbar 185 formed on the first tandem solar cell 115A (bottom solar cell). The busbar 185 may be formed as part of a top metal pattern 181, which can include metal fingers 180 spanning over the first tandem solar cell 115A. The busbar and fingers can however be omitted at locations where light transmission is preferred.

In the particular embodiment illustrated in FIGS. 3A-3B, the second tandem solar cell 115B (top solar cell) can be bonded to the first tandem solar cell 115A (lower solar cell) at a variety of locations. For example, referring briefly back to FIGS. 2A-2B, the back side contact 310 (electrode) of the top tandem solar cell 115B can be bonded to the metal fingers 180 (or busbar 185) or electrode layer 170 of the lower tandem solar cell 115A with the ECA 190. s described in further detail herein, the top perovskite subcell 220B of the lower tandem solar cell 115A can be patterned to form a contact ledge to avoid stress on the absorber layer 140 the lower solar tandem cell 115A, which help avoid shorting and mechanical breakage when a threshold bonding pressure is exceeded or during installation and operation of the eventual module that includes the solar cell strings described herein.

Figure 4:
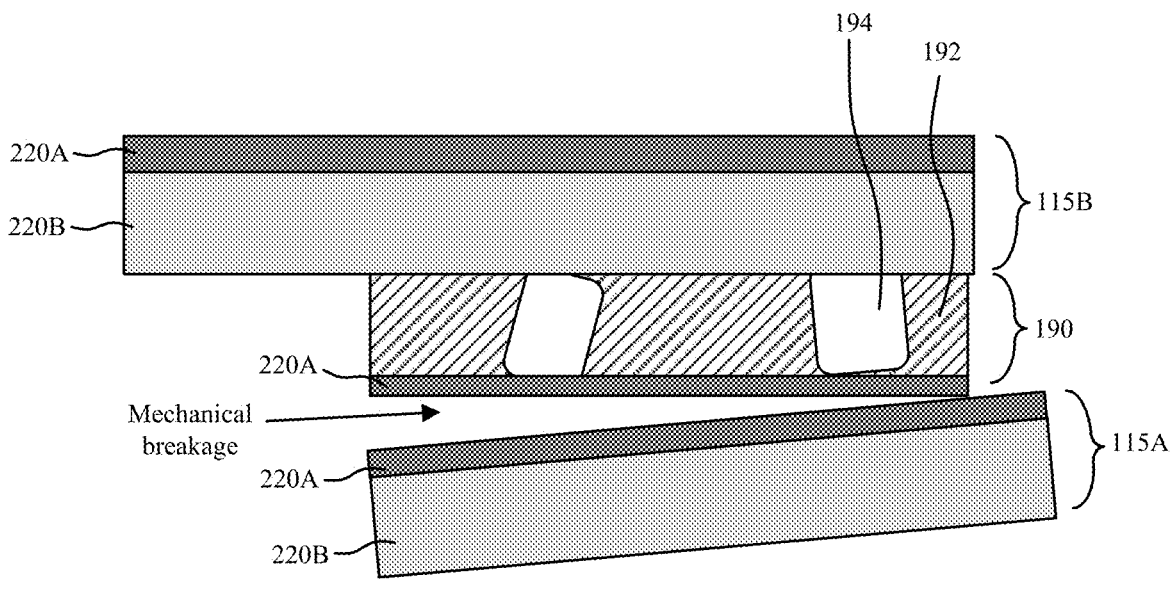
FIG. 4 is a schematic cross-sectional side view illustration of mechanical breakage in a perovskite subcell.

As shown in FIGS. 3A-3B, connecting two single junction cells (e.g. solar cells of FIG. 2A) in series by overlapping them can be straightforward. It has been observed that connecting tandem cells, however, can be challenging for several reasons. In particular, both liquid and solid tape ECAs usually comprise irregularly shaped metallic particles with >1 μm sizes for liquid ECAs and >25 μm sizes for solid tape ECAs, and the pressure used to laminate the module together (e.g. the back side of a second tandem solar cell 115B onto the top side of a first tandem solar cell) can cause the particles to "punch" through the <1 μm thick perovskite absorber part of the lower perovskite subcell 220B, effectively creating a short circuit through the perovskite half of the tandem solar cell. As shown in FIG. 4, localized adhesion and pressure at the ECA joint between the perovskite front and the silicon back of two tandem solar cells can cause mechanical breakage within a mechanically weak top subcell 220B, such as a perovskite subcell 220B, when the cells or module are placed under mechanical stress such as that experienced during manufacturing or module installation and operation.

In accordance with some embodiments, the front surface (often termed the "front emitter") of the lower solar cell 115A is patterned so that a conductive particle (from ECA 190) does not punch through the front perovskite subcell 220B and negatively impact the electrical properties of the connection. Such patterning can be done through lithography or shadow masking during doping processes (e.g. for the n-doped silicon layer 350 on P-type wafers for the silicon Tunnel Oxide Passivated Contact (TOPCon) or Passivated Emitter and Rear Contact (PERC) cells, not necessary for heterojunction cells), depositions, or by laser patterning post processing. The recombination layer 355 is usually laterally conductive so it may also be patterned in a similar way. In the case of a heterojunction cell with a low conductivity front side (n side in the most common tandem configuration) passivation, the silicon front surface does not need to be patterned, but the recombination layer (e.g. TCO) does. This can be done either by shadow masking or by laser patterning.

In accordance with embodiments, a perovskite subcell 220 within a tandem subcell can be comparatively weak compared to a silicon subcell 220. In accordance with embodiments, the perovskite subcell, and in particular the absorber layer 140 can be patterned either during deposition (e.g. with shadow mask) or by post deposition laser ablation.

In the following description of FIGS. 5-9 various connected (e.g. overlapping) tandem solar cell arrangements and methods of fabrication and assembly are described. In particular, the tandem solar cell arrangements described and illustrated are similar to that illustrated and described with regard to FIGS. 2A-2B. As such, specific layers or compositions may not be separately described again. Furthermore, while embodiments are described with regard to the specific arrangements illustrated in FIGS. 2A-2B, embodiments are not so limited, and may be employed using tandem solar cells based upon other stack-ups or other materials not including silicon. Embodiments may additionally be employed with any materials system in which the top subcell is mechanically weaker than the bottom subcell, and therefore are also not limited to perovskite top subcells, or a silicon-perovskite tandem solar cell.

Figure 5:
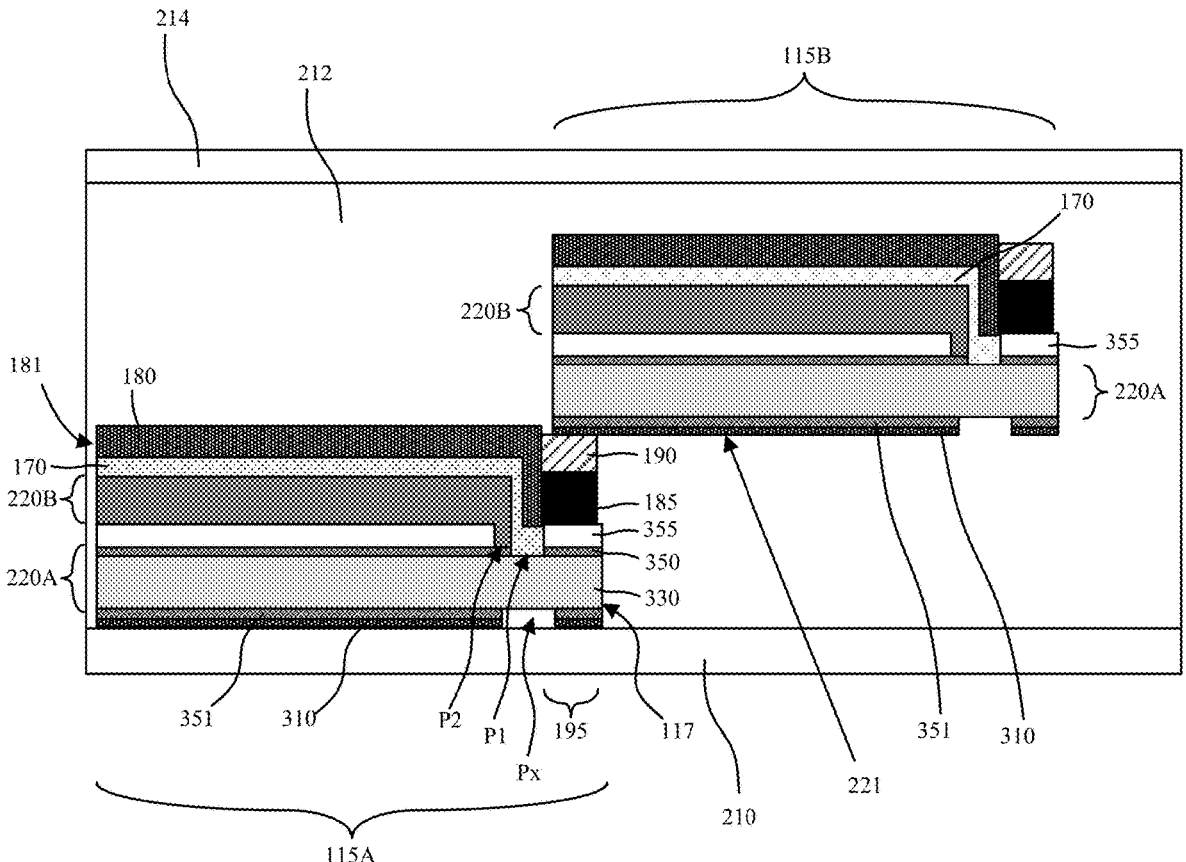
FIG. 5 is a schematic cross-sectional side view illustration of a pair of overlapped solar cells connected along a patterned subcell ledge in accordance with an embodiment.

Referring now to FIG. 5, a schematic cross-sectional side view illustration is provided for a pair of overlapped solar cells connected along a patterned subcell ledge in accordance with an embodiment. As shown, a solar cell module can include a first tandem solar cell 115A (lower solar cell) including a first lower silicon subcell 220A, and a first upper perovskite subcell 220B that is patterned to form a contact ledge 195 over the first lower silicon subcell 220A. The second (upper) tandem solar cell 115B also includes a second lower silicon subcell 220A and a second upper perovskite subcell 220B. As shown, a back side 221 of the second lower silicon subcell 220A is bonded to the contact ledge 195 with an electrically conductive adhesive layer (ECA) 190. As previously described, the ECA 190 can include an electrically conductive material 194 (e.g. pins, particles, etc.) within a polymer matrix 192. Contact ledge 195 may intersect with a lateral edge 117 of the first tandem solar cell 115A. It is to be appreciated that other electrically conductive bonding materials, including solders, solder pastes, etc. may be used in place of the ECA 190 with such a contact ledge 195 arrangement while still mitigating stress on the upper perovskite subcell 220B.

As shown in the particular embodiment illustrated, a laterally conductive recombination layer 355 is located between the first lower silicon subcell 220A and the first upper perovskite subcell 220B. A first transparent top electrode layer 170 can also be formed and patterned over the underlying perovskite subcell 220B. In the illustrated embodiment, the first transparent top electrode layer optionally does not span over the contact ledge 195. A first top metal pattern 181 can then be formed spanning over the first transparent top electrode layer 170 and the laterally conductive recombination layer 355 on the contact ledge 195 to form a busbar 185 on the contact ledge. Thus, the busbar 185 and the metal fingers 180 of the top metal pattern 181 may be simultaneously formed, or separately formed. As shown, the back side 221 (which may optionally be back side contact 310 of FIGS. 2A-2B) of the second lower silicon subcell 220A can be bonded to the busbar 185 with the ECA 190.

In order to prevent shorting across solar cells various patterned line openings of varying widths may be formed. For example, a first patterned line opening (P1) can be formed through a top surface of the first lower silicon subcell 220A. In the particular embodiment illustrated this may be through n-doped silicon layer 350. It is to be appreciated this is exemplary, and doping may be reversed. Such an opening may not be required for heterojunction (HJT) solar cells. The first patterned line opening may be formed in appropriate silicon subcells 220A to avoid shorting between highly doped layers 350. In the particular embodiment illustrated a second patterned line opening (P2) is formed through the laterally conductive recombination layer 355, wherein the P2 is directly over and wider than the P1. The back metallization and back doped layer of the silicon subcell 220A may be similarly patterned with a back side patterned line opening (Px) to prevent current flow in the overlapping region. Px may be directly underneath P1, and have similar dimensions for example. The relative widths of the P1 and P2 openings can also be reversed, with the precondition that one overlaps the other.

A plurality of overlapped tandem solar cells can be integrated into a module including a back sheet 210, a transparent encapsulant 212 around the plurality of tandem solar cells, and a transparent cover layer 214 such as glass.

Figures 6A, 6B, 6C, 6D:
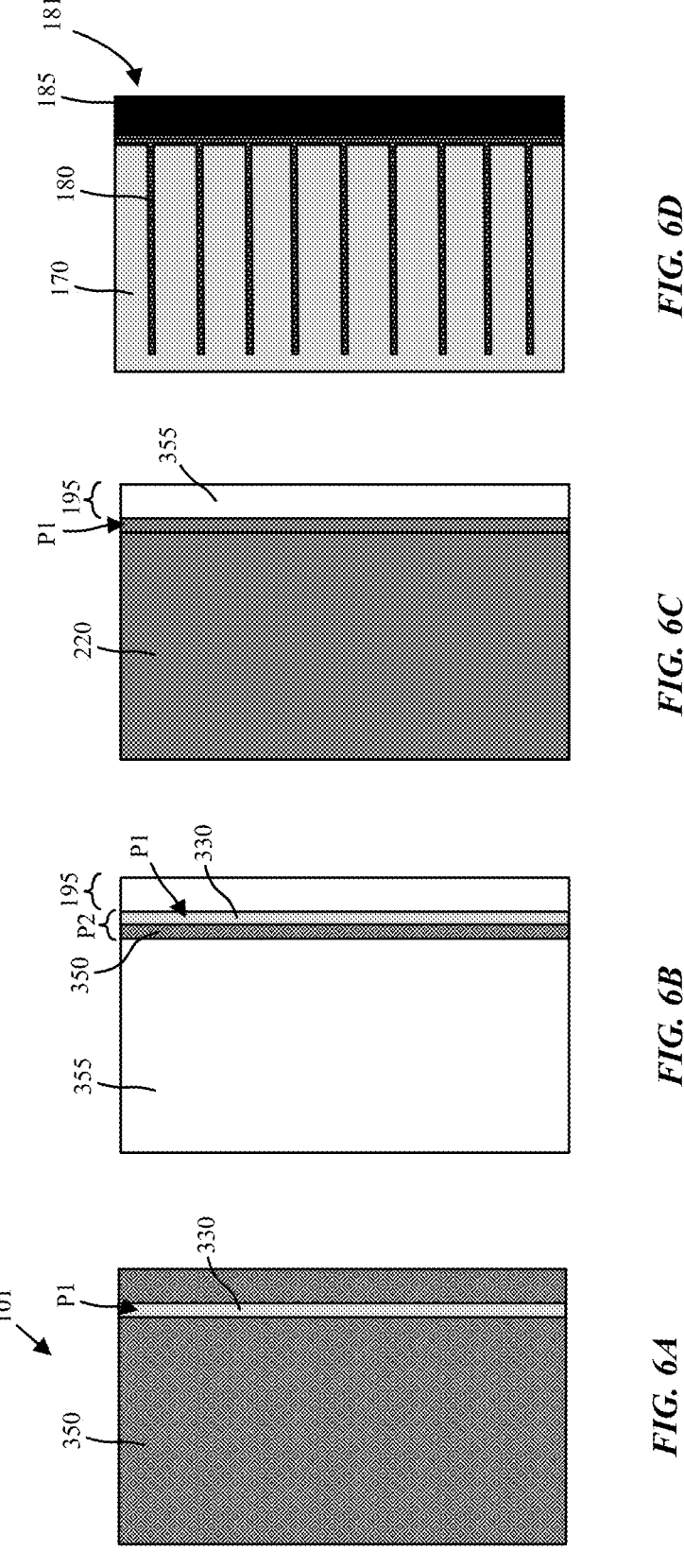
FIG. 6A is a schematic top view illustration of a silicon subcell patterned across a conductive front surface in accordance with an embodiment.
FIG. 6B is a schematic top view illustration of a recombination layer with patterned opening over the underlying silicon pattern in accordance with an embodiment.
FIG. 6C is a schematic top view illustration of a perovskite subcell patterned to expose a contact ledge of the recombination layer in accordance with an embodiment.
FIG. 6D is a schematic top view illustration of front fingers and busbar deposited over the patterned solar cell in accordance with an embodiment.

A process sequence for forming an exemplary solar cells 115 of FIG. 5 is provided in FIGS. 6A-6D. As shown, in FIG. 6A the sequence can begin with a silicon subcell wafer 101 that is patterned across a conductive front and back surfaces. Depending upon the type of silicon subcells to be formed, this front pattern may be across the n-doped silicon layer 350 of the exemplary embodiment. As shown in FIG. 6B, a recombination layer 355 can be added and patterned with a second patterned line opening (P2) wider than the P1 (e.g. silicon cut). The perovskite subcells 220A can then be formed and patterned as shown in FIG. 6C, exposing the contact ledge 195. For example, the contact ledge 195 may be exposed recombination layer 355. Processing of the top perovskite subcell 220B can then be completed including the top electrode layer 170 (e.g. TCO) and top metal pattern 181 (e.g. including fingers 180 and busbar 185).

In other embodiments the perovskite subcell 220B is not patterned into a ledge. For example, in certain configurations it may not be necessary to pattern the perovskite subcell, but still necessary to pattern the front/back emitters and recombination layers.

In other embodiments, only the perovskite or the silicon layers are patterned, or only the silicon layers are patterned. Solar cells in accordance with embodiments are envisioned where tandems are formed without a laterally conductive recombination layer.

Figure 7:
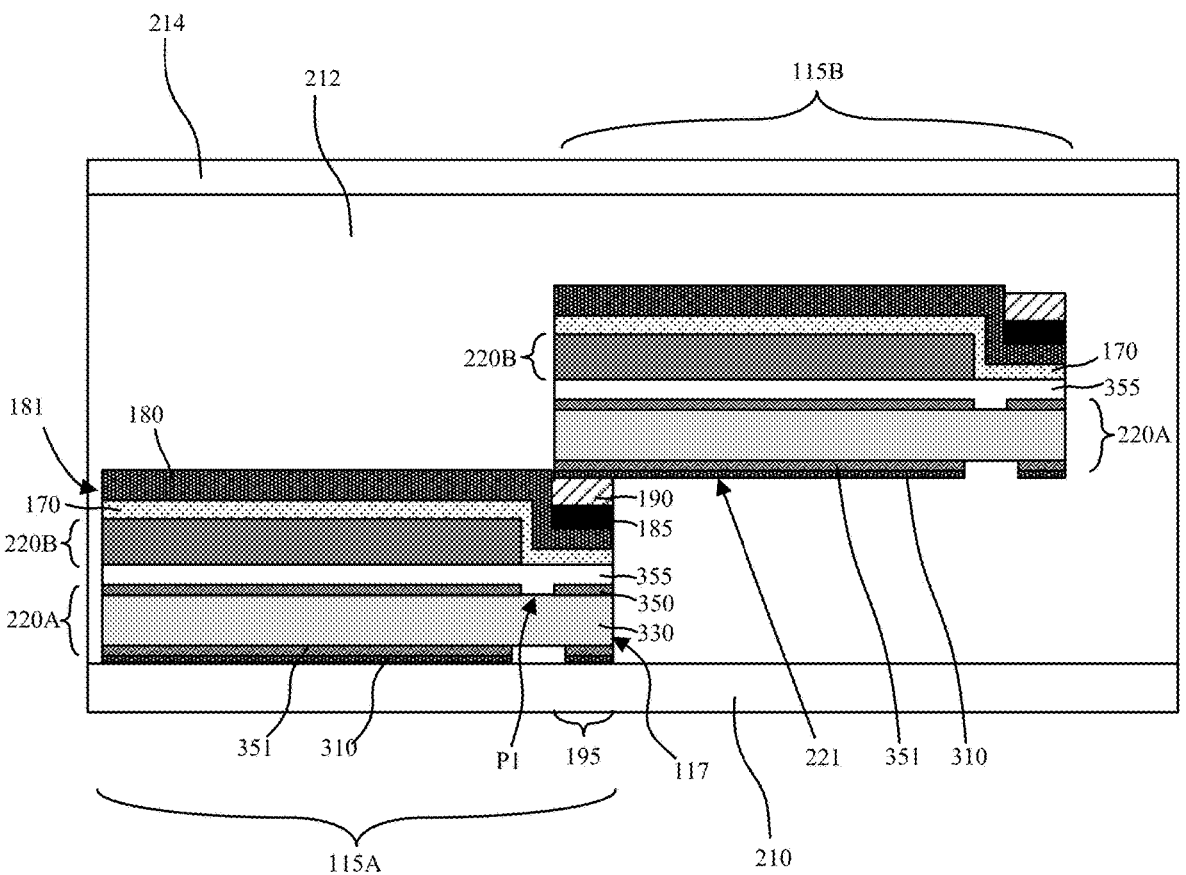
FIG. 7 is a schematic cross-sectional side view illustration of a pair of overlapped solar cells connected along a patterned subcell ledge in accordance with an embodiment.

FIG. 7 is a schematic cross-sectional side view illustration of a pair of overlapped tandem solar cells connected along a patterned subcell ledge in accordance with an embodiment. FIG. 7 may be substantially similar to that of FIG. 5, with one difference being the recombination layer 355 not being laterally conductive. In such an embodiment, it is not necessary to form a second patterned line opening (P2), and the recombination layer 355 can span over and at least partially fill the first patterned line opening (P1). Similar to the embodiment of FIG. 5, the perovskite subcell 220B can be removed at the mechanical connection point defining the contact ledge. It is to be appreciated that other electrically conductive bonding materials, including solders, solder pastes, etc. may be used in place of the ECA 190 with such a contact ledge 195 arrangement while still mitigating stress on the upper perovskite subcell 220B.

Figure 8:
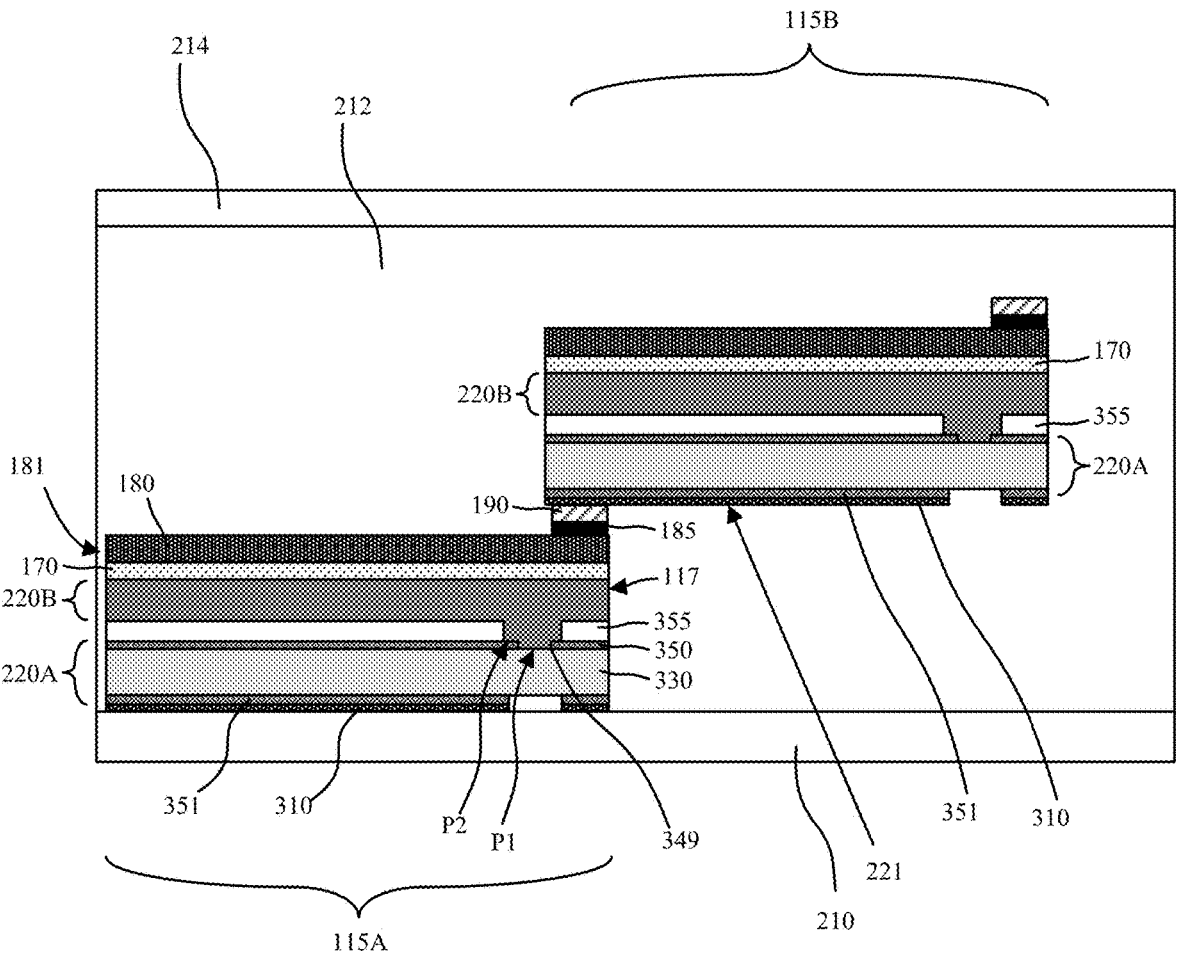
FIG. 8 is a schematic cross-sectional side view illustration of a pair of overlapped solar cells in accordance with an embodiment.

FIG. 8 is a schematic cross-sectional side view illustration of a pair of overlapped tandem solar cells in accordance with an embodiment. In such an embodiment, the overlapping tandem solar cells 115 can be stacked back-to-front without removing the top subcell 220B (e.g. perovskite). As with previous embodiments, the busbar 185 can optionally be formed to enhance contact with the ECA 190. The busbar 185 may be formed as part of the same layer as the metal fingers 180 or as a separate layer. In an embodiment, the solar cell module includes a first transparent top electrode layer 170 over the first upper perovskite subcell 220B, and a first top metal pattern 181 spanning over the first transparent top electrode layer 170, the first top metal pattern including a plurality of metal fingers 180 and a busbar 185 adjacent a lateral edge 117 of the first tandem solar cell. The back side 221 of the second tandem solar cell 115B is bonded to the busbar 185 with the ECA 190. In the illustrated embodiment, the first tandem solar cell 115A includes a first patterned line opening (P1) through a top surface of the first lower silicon subcell 220A. The busbar 185 is parallel to the P1, and the busbar 185 may be substantially located laterally adjacent to a first lateral edge 349 of P1. For example, the first lateral edge 349 may be the edge of P1 closest to the lateral edge 117 of the first tandem solar cell 115A. Such a configuration may mitigate the overlapping area of the active regions of the tandem solar cells. In an embodiment, the first tandem solar cell 115 further includes a recombination layer 355 between the first lower silicon subcell 220A and the first upper perovskite subcell 220B, and a second patterned line opening (P2) through the recombination layer such that P2 is directly over and wider than P1.

Figure 9:
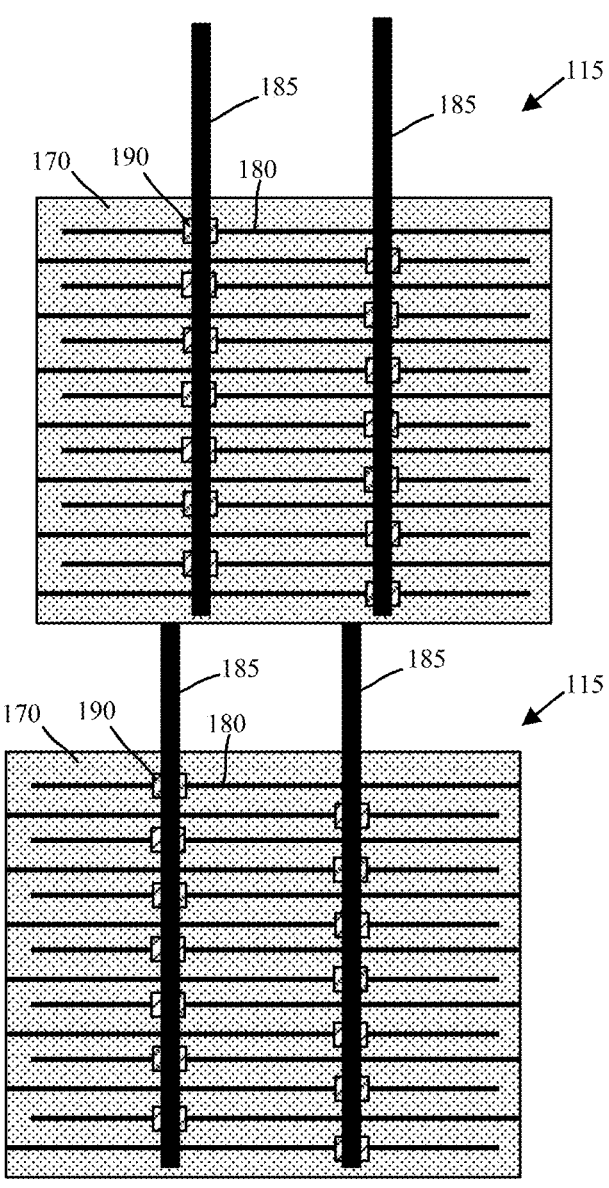
FIG. 9 is a schematic top view illustration of on-cell busbars in accordance with an embodiment.

While up until this point ECAs 190 have been described with regard to bonding of tandem solar cells to one another, ECAs 190, and in particular solid ECAs such as tapes, can be used to bond busbars 185 (e.g. such as flat metal ribbons) to underlying structures. FIG. 9 is a schematic top view illustration of on-cell busbars 185 in accordance with an embodiment. As shown, the tandem solar cell 115 may include fingers 180 formed using conventional deposition techniques of the tandem solar cell 115. This can be followed by bonding on-cell busbars 185 (e.g. flat metal ribbons) using solid ECAs 190. In this manner, multiple tandem solar cells 115 can be connected to one another. In an embodiment, a solar cell module includes a first tandem solar cell including a first plurality of metal fingers, a second tandem solar cell including a second plurality of metal fingers, and a busbar bonded to the first plurality of metal finger with an electrically conductive adhesive material, and bonded to a back side of the second tandem solar cell with a second electrically conductive adhesive material, and so forth for additional connections.

In utilizing the various aspects of the embodiments, it would become apparent to one skilled in the art that combinations or variations of the above embodiments are possible for forming a solar cell module with overlapping tandem solar cells. While embodiments have been described herein with regard to silicon-perovskite tandem solar cells, this is exemplary, and embodiments can be applied to alternative tandem solar cell compositions. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell module comprising:
   a first tandem solar cell including:
      a first lower silicon subcell, the first lower silicon subcell comprising first patterned line opening (P1) through a top surface of the first lower silicon subcell;
      a first upper perovskite subcell patterned to form a contact ledge over the first lower silicon subcell;
      a first transparent top electrode layer over the first upper perovskite subcell;
      a recombination layer between the first lower silicon subcell and the first upper perovskite subcell;
   a second tandem solar cell including;
      a second lower silicon subcell;
      a second upper perovskite subcell;
   a first top metal pattern spanning over the first transparent top electrode layer where the first transparent top electrode layer is over the first upper perovskite subcell, and spanning over the recombination layer on the contact ledge to form a busbar on the contact ledge;
   wherein a back side of the second lower silicon subcell is bonded to the busbar on the contact ledge with an electrically conductive adhesive layer.

2. The solar cell module of claim 1, wherein the electrically conductive adhesive layer includes an electrically conductive material within a polymer matrix.

3. The solar cell module of claim 1, wherein the first transparent top electrode layer does not completely span over the contact ledge.

4. The solar cell module of claim 1, further comprising a second patterned line opening (P2) through the recombination layer.

5. The solar cell module of claim 4,
   wherein the P2 is directly over and wider than the P1.

6. The solar cell module of claim 5, wherein the first upper perovskite subcell at least partially fills the P2.

7. The solar cell module of claim 1, wherein the P1 is through a top doped silicon layer of the first lower silicon subcell.

8. The solar cell module of claim 7, wherein the first lower silicon subcell comprises a doped silicon substrate, a bottom doped silicon layer underneath the doped silicon substrate, and the top doped silicon layer.

9. The solar cell module of claim 8, further comprising a back side patterned line opening (Px) through the bottom doped silicon layer.

10. The solar cell module of claim 9, wherein the Px is directly underneath the P1.

* * * * *